United States Patent [19]
Jones et al.

[11] Patent Number: 5,443,686
[45] Date of Patent: Aug. 22, 1995

[54] PLASMA CVD APPARATUS AND PROCESSES

[75] Inventors: Fletcher Jones, Ossining; Kenneth J. Muroski, Jr., Millbrook; Bennett Robinson, New York, all of N.Y.

[73] Assignee: International Business Machines Corporation Inc., Armonk, N.Y.

[21] Appl. No.: 821,515

[22] Filed: Jan. 15, 1992

[51] Int. Cl.⁶ .......................................... H01L 21/00
[52] U.S. Cl. ..................... 216/37; 118/715; 118/724; 118/733; 118/723 MB; 156/345; 216/67; 216/79
[58] Field of Search .............. 118/723, 724, 715, 733; 156/345, 643

[56] References Cited

U.S. PATENT DOCUMENTS

| | | | |
|---|---|---|---|
| 3,517,643 | 6/1970 | Goldstein et al. | 118/48 |
| 3,904,501 | 9/1975 | Lagow et al. | 204/164 |
| 4,330,932 | 5/1982 | Morris et al. | 437/80 |
| 4,430,547 | 2/1984 | Yoneda et al. | 156/643 |
| 4,572,759 | 2/1986 | Benzing | 156/643 |
| 4,750,980 | 6/1988 | Hynecek | 156/646 |
| 4,786,352 | 11/1988 | Benzing | 156/345 |
| 4,989,540 | 2/1991 | Fuse et al. | 118/724 |
| 5,030,319 | 7/1991 | Nishino et al. | 156/643 |

FOREIGN PATENT DOCUMENTS

| | | |
|---|---|---|
| 0115970 | 8/1984 | France . |
| 54-162969 | 12/1979 | Japan . |
| 57-053939 | 3/1982 | Japan . |
| 63-283031 | 11/1988 | Japan . |
| 03238747 | 10/1991 | Japan . |

OTHER PUBLICATIONS

IBM Tech. Disc. Bulletin, vol. 32, No. 2, Jul., 1989, p. 494, "Inorganic Growth of GaAs and GaAlAs".
Patent Abstracts of Japan, vol. 13, No. 479, Japanese Patent Appl. A–11 88678 (Mitsubishi) Jul. 27, 1989.
Patent Abstracts of Japan, vol. 12, No. 223, Japanese Patent Appl. A–63 020482 (Canon) Jan. 28, 1988.
Patent Abstracts of Japan, vol. 5, No. 15, Japanese Patent Appl. A–55 145338 (Shibaura) Nov. 12, 1980.
Patent Abstracts of Japan, vol. 6, No. 128, Japanese Patent Appl. A–57 053930 (Matsushita) Mar. 31, 1982.
Database WPI, Sect. Ch, Week 2480, Japanese Patent Appl. A–55 0597(Hitachi) May 7, 1980.

Primary Examiner—R. Bruce Breneman
Assistant Examiner—G. Goudreau
Attorney, Agent, or Firm—Perman & Green

[57] ABSTRACT

Processes for producing and using a novel CVD apparatus for depositing silicon layers onto suitable substrates and for the in-situ etching removal of background silicon deposits from the interior walls of the apparatus. The invention comprises using an apparatus having a fused quartz reaction chamber and precoating the interior wall of the reaction chamber with a thin continuous barrier layer of $Al_2O_3$ which is inert to the etching gas introduced for the removal of the background silicon deposits.

19 Claims, 1 Drawing Sheet

PLASMA CVD APPARATUS AND PROCESSES

BACKGROUND OF THE INVENTION

1. Field of the Invention

The present invention relates to an improved apparatus for the low pressure chemical vapor deposition (LPCVD) of thin silicon films, including polysilicon, $SiO_2$, $Si_3N_4$, silicon oxynitride and related materials, hereinafter referred to as silicon films, onto substrates such as device wafers or semiconductor bodies, and/or for the selective etching of lithographic patterns in such thin films, such as during the production of semiconductor circuits, and to processes for making and using same.

Conventional devices used for the LPCVD process contain a cylindrical reaction chamber, tube or belljar into which the substrate to be coated and/or etched is inserted and into which the vapor-forming gases are supplied. The reaction chamber commonly comprises an elongate tube or cylinder of quartz ($SiO_2$) ceramic or of fused quartz and contains or communicates with a heater for reacting and decomposing the vapor-forming deposition gases, to cause the low pressure deposition of a desired silicon layer onto the substrate and/or a high frequency inducing means for forming an etchant plasma from etchant gases to cause plasma etching and removal of portions of a silicon layer from the substrate.

However, the LPCVD of silicon layers within a CVD reaction chamber causes the Silicon film to deposit on and coat the quartz wall of the reaction chamber. Deposited silicon layer wall coatings become thick and crack and flake after several deposition cycles, producing contamination requiring periodic removal and cleaning of the reactor wall or tube. This is time-consuming and requires shut-down of the apparatus. In the case of etchant gases, such as $CF_4/O_2$, $SF_6/O_2$ and $NF_3$, such gases attack and etch away the quartz wall of the reaction chamber during repeated use and require eventual replacement thereof.

2. Discussion of the Prior Art

U.S. Pat. No. 4,529,474 discloses a method for cleaning silicon deposits from the walls of CVD reaction chambers, in-situ without removing the reaction chamber wall from the apparatus, by etching such deposits from the chamber wall using $CF_4/O_2$ plasma as an etchant gas. Such a method is useless in cases where the reactor wall or tube is susceptible to being etched or corroded by fluorine-containing gases, as in the case of $SiO_2$ walls such as quartz.

U.S. Pat. No. 4,707,210 discloses a CVD apparatus having an aluminum reactor wall in place of a stainless steel reactor wall, to overcome the problem of corrosion of the stainless steel reactor wall by fluorine-containing etchant gases. However, aluminum reactor walls are not resistant to temperatures above about 600° C., which temperatures are frequently reached in the LPCVD process for producing semiconductors. Any sublimation of aluminum within the reaction chamber produces unacceptable contamination of the substrate being coated and eventful destruction of the wall.

U.S. Pat. No. 4,633,812 discloses a CVD apparatus having reactor wall portions which are resistant to corrosion by fluorine-containing gas plasma, characterized by the use of a reactor wall consisting of a sintered dielectric wall material of alumina ceramic. While such alumina ceramic portions wall are highly resistant to corrosion by fluorine-containing etching gases, they are not ideal for vacuum processes because they are not very dense and are somewhat porous, and they cannot be formed to have integral flanges, as is possible with fused quartz.

SUMMARY OF THE INVENTION

The present invention is based upon the discovery of a novel CVD coating and/or etching apparatus in which the vacuum reaction chamber enclosure, wall or tube can be cleaned in-situ, relatively quickly and without turning off the CVD reactor, characterized by the reaction chamber wall or tube consisting of fused quartz and being provided with an interior protective barrier layer of a refractory metal oxide such as $ZrO_2$, $HfO_2$ or, most preferably, $Al_2O_3$.

CVD tubes used in the manufacture of VLSI/ULSI circuits are conventionally made of fused quartz rather than quartz ceramics. Fused quartz is ideal for such utility because it can be readily formed into very large shapes, e.g., 6 feet in length, 10 inches in diameter, or larger, and very small shapes, is very dense and non-porous and can be formed to have integral vacuum sealing surfaces or flanges.

We have discovered that the interior reaction chamber surface of a fused quartz wall or tube can be rendered resistant to attack by etchant plasma gases, such as fluorine-containing gases, by coating such surface with a thin, continuous barrier layer of a refractory metal oxide such as $ZrO_2$, $HfO_2$ or, most preferably, $Al_2O_3$ which preferably is applied by the chemical vapor deposition process and adheres strongly to the fused quartz surface.

The deposition of refractory metal oxide such as $Al_2O_3$ onto a variety of surfaces, including silicon substrates, is well known by a variety of different processes. A preferred process comprises the chemical vapor deposition of $Al_2O_3$ by the pyrolytic decomposition of aluminum alkoxides, preferably aluminum triisopropoxide, at elevated temperatures in the area of about 420° C. Reference is made to procedures and deposition equipment disclosed in an article titled "Deposition and Properties of Aluminum Oxide by Pyrolytic Decomposition of Aluminum Alkoxide" by J. Aboaf, Journal of Electrochemical Society, Vol. 114, pp. 948-(1967), and an article titled "Multilayer Metallization With Planar Interconnect Structure Utilizing CVD $Al_2O_3$ Film" by H. Mutah et al., same journal, Vol. 122, pp. 987 (1975).

Refractory metal oxide coatings used according to the present invention preferably have a thickness between about 0.25 and 1.0 microns, and preferably are applied at a temperature proximate the deposition temperature of the apparatus so as to eliminate thermal stress effects when the background deposition of silicon film material occurs over the refractory metal oxide barrier layer during subsequent use of the apparatus.

The formed coatings, such as $Al_2O_3$, are glossy transparent films which are continuous, homogeneous, chemically-inert to silicon deposits and to silicon-etching gases such as flourine-containing gases, highly heat-conductive and resistant to thermal shock, and have a thermal coefficient of expansion very similar to that of fused quartz so as to posses excellent bonding strength for fused quartz over a wide range of temperatures which may be present in the CVD process.

While the application of the refractory metal oxide barrier layer to a fused quartz CVD tube or reaction chamber used according to the present invention does not prevent the undesired deposition of the silicon film on the reactor wall or tube, it does provide an inert barrier against the penetration of etchant gases, which normally would etch, corrode and destroy the fused silica wall or tube. This enables the present LPCVD apparatus to be cleaned of silicon film deposit periodically, in an etching cycle, without turning off the CVD reactor, by merely evacuating the silicon-forming gas from the chamber and introducing a gas capable of forming an etchant plasma capable of reacting with and vaporizing the unwanted silicon deposit present on the refractory metal oxide barrier layer. In this manner the unwanted silicon film deposit can be vaporized and removed simply and quickly, before accumulating to contaminating thicknesses, without any degradation of the fused quartz wall or tube. This latter property adapts the present invention to use in etching devices having reactor chamber walls formed of fused quartz.

DETAILED DESCRIPTION

Figure 1:
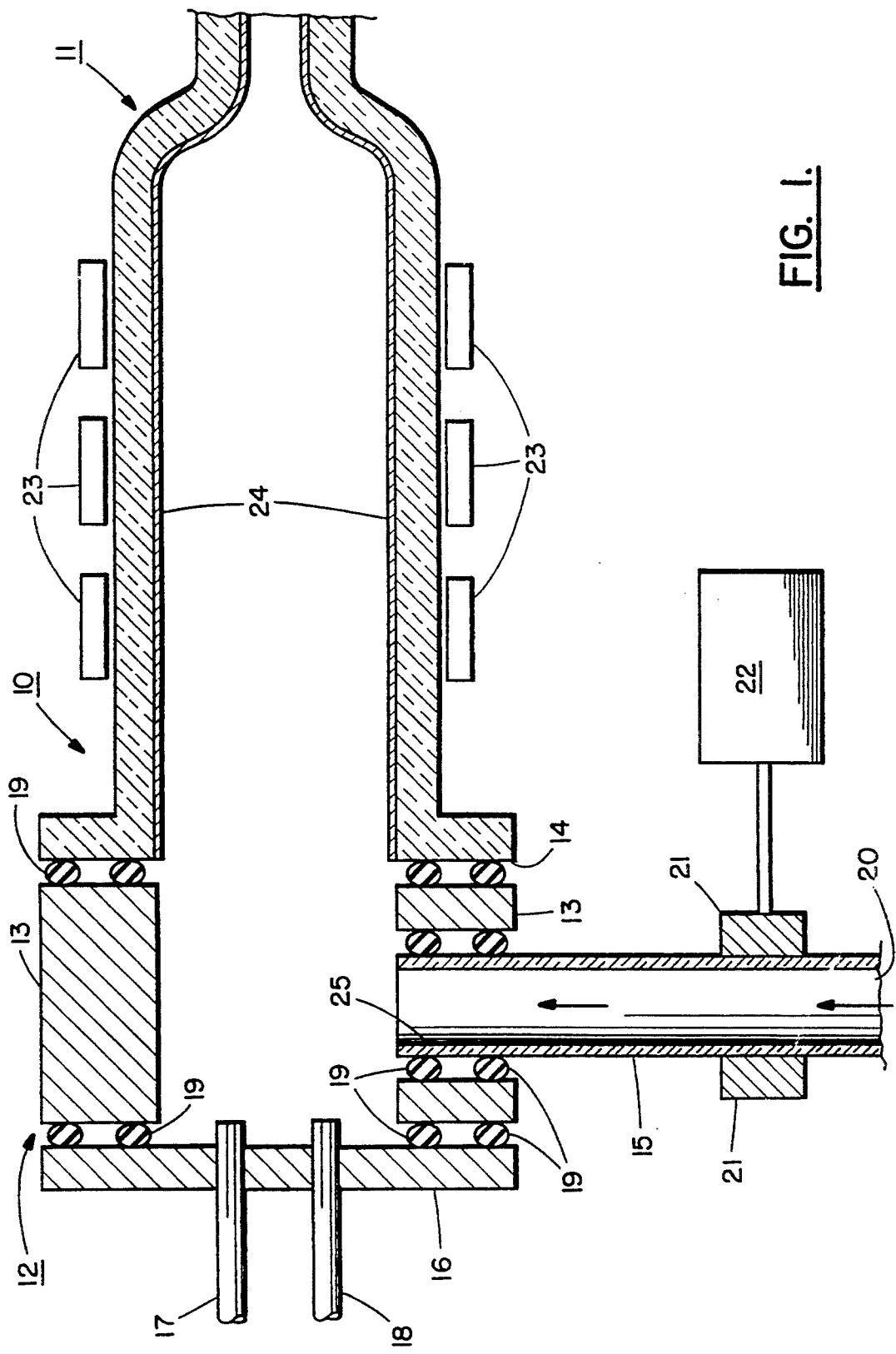
FIG. 1 is a schematic illustration of a low pressure chemical vapor coating apparatus of the type suitable for use according to the present invention.

The low pressure CVD apparatus 10 of FIG. 1 comprises an electronic grade, elongate fused quartz tube 11, a flanged, wide upstream end of which is assembled with a gas manifold 12, and a narrow downstream neck of which communicates with an exhaust system (not shown) at the narrow outlet end, to provide a reaction chamber, such as for the reception of a plurality of silicon wafers mounted in spaced relation on a holder (not shown). The vacuum manifold 12 comprises an annular wall 13 having a radial or transverse opening 14 for an etchant system comprising an etchant gas inlet tubing 15, and a door 16 at the wide entrance end. The door 16 is provided with CVD process gas inlets 17 and 18. The annular wall 13 of the reaction chamber is provided with a plurality of o-rings 19 for sealing engagement between the fused quartz tube 11, the annular wall 13, the door 16 and the inlet tubing 15.

The etchant gas inlet tubing 15 has an inlet end 20 for the reception of a valved supply of etchant gas, such as $NF_3$ or $CF_4/O_2$ mixture, and is associated with a microwave applicator 21 having a microwave power supply 22. The etchant system is activated periodically in order to supply etchant gas and generate a plasma thereof to etch away undesirable silicon film deposit from the inner surface of the quartz tube 11 and tubing 15, as will be discussed more fully hereinafter.

In operation of the apparatus according to the hot wall system, silicon wafers or other substrates to be coated with a silicon film are introduced to the interior of the reaction chamber within the tube 11 through door 16, after which door 16 is sealed, the chamber is evacuated by drawing a vacuum of at least about $10^{-6}$ Torr at the narrow outlet end of the tube 11 and heat is applied by annular resistance heaters 23 wrapped around the tube 11 which heat the wall and wafers through internal-directed radiation.

Next the suitable CVD process gases are introduced through inlets 17 and 18. The surface temperature of the tube is high enough to cause the injected gases to react or decompose and subsequently deposit the desired silicon film material, such as polysilicon, $SiO_2$, $Si_3N_4$, silicon oxynitride and related materials onto the wafers. However, the deposited material coats not only the silicon wafers, as desired, but also the interior wall of the reaction chamber, including the tube 11.

According to the present invention the CVD apparatus is provided with an etchant gas system which enables etchant gases to be introduced to the reaction chamber periodically, as required, to develop etchant plasma and etch away undesired silicon deposit from the inner surface of the reaction chamber including the fused quartz, in-situ and without any disassembly of the apparatus.

The combination of chemical vapor deposition and etching systems in the same CVD apparatus is made practical by the discovery that the fused quartz can be made inert to the normal etching effect of the etchant gases by precoating the inner surface of the tube 11 and of the fused quartz etchant gas tubing 15 with a thin barrier layer 24, 25 of a refractory metal oxide such as $ZrO_2$, $HfO_2$ or, most preferably, $Al_2O_3$. Such barrier layer is receptive to the deposit of the silicon film during the CVD hot wall coating of the silicon wafers and prevents the silicon gases from penetrating to the fused quartz surfaces. Moreover, such barrier layers 24 and 25 are inert to etchant gases which are introduced to etch away and remove the silicon film deposit from the interior surface of the reaction chamber, including the inner surfaces of the fused quartz tube 11 and tubing 15, whereby the undesired silicon deposit can be etched away from time to time without damaging the refractory metal oxide barrier layers 24 or 25 or the fused quartz tube 11 or tubing 15.

The CVD reaction chamber is closed to the downstream etchant system during the normal wafer-coating hot wall step, and only communicates therewith when necessary to remove undesired silicon accumulation. Thus, after the coated silicon wafers or other substrates are removed from the reaction chamber, or after masked wafers are introduced for purposes of etching away exposed silicon film portions thereof, etchant gases, such as a mixture of $CF_4$ and $O_2$, or $NF_3$, is introduced through inlet 20 while a microwave frequency of about 2.45 GHz is generated by power supply 22 and applied to the tubing 15 by microwave applicator 21. The microwaves generate an etchant gas plasma which is forced through the fused quartz tubing 15 into the fused quartz tube 11, reacting with and vaporizing the undesired silicon deposit from the inert surface of the barrier layers 24 and 25 (and from the masked wafers, if present) as a gaseous silicon fluoride reaction product which is withdrawn through the narrow end of the tube 11. The undesired silicon deposit is removed substantially completely after a reasonable period of time.

The following example illustrates the application of $Al_2O_3$ surface coatings 24 and 25 to fused quartz reaction chamber tube 11 and etchant gas tubing 15, for production of the apparatus of FIG. 1.

EXAMPLE 1

A VLSI fused quartz reaction tube 11 having a length of 6 feet and a diameter of 10 inches, and a length of fused quartz tubing 15 having a diameter of 2 inches, are individually CVD coated by exposing the interior surfaces thereof to a continuous flow of aluminum tri-isopropoxide vaporized in nitrogen gas at 170° C., the fused quartz being heated to a temperature of 420° C. The hot walls of the tube 11 and tubing 15 pyrolyse the gas to form $Al_2O_3$ which deposits thereon uniformly at a given rate of the reactant gas. Exposure is continued until the desired thickness of the $Al_2O_3$ coating is obtained, normally between about 0.25 u to 1.0 u.

Other known refractory metal oxide-deposition processes are also suitable, such as electron beam evaporation, oxidation of a refractory metal coating, sputtering of the metal oxide, etc. The essential novelty resides in applying such a coating to fused quartz CVD or etching reaction chamber components.

As noted, the essential importance of the present apparatus resides in a combination chemical vapor deposition and plasma etching apparatus which can be purged of undesirable background silicon film deposit periodically, without any disassembly of the apparatus and without any corrosion of the reaction chamber. In effect, the present apparatus is self-cleaning if it is used periodically for the etching of photoresist-exposed areas of silicon wafers or other substrates since the removal of such areas by the etchant gas plasma is accompanied by the vaporization and removal of background silicon deposits present on the refractory metal oxide coating on the interior walls of the fused quartz components of the reaction chamber.

The following example illustrates the use of the present apparatus for the hot wall deposition of a silicon film on silicon wafers, followed by the purging or in-situ cleaning of the apparatus to remove silicon film build-up from the reaction chamber walls.

EXAMPLE 2

The apparatus of FIG. 1 has inserted within the elongate horizontal reaction chamber thereof an elongate wafer holder carrying a plurality of spaced silicon wafers. This is accomplished by removing the cover or door 16 and positioning the wafer holder within the $Al_2O_3$-coated tube 11 so that the wafers are centered within the wrap-around heaters 23. Door 16 is secured and a vacuum of about $10^{-6}$ Torr is created by a pump at the exhaust end of the tube 11. The heaters 23 are energized to heat the wall of the tube 11 to about 420° C., and silane and hydrogen processing gases are introduced at inlets 17 and 18. The processing gases react at the hot $Al_2O_3$ surface coating inside the tube 11 and a thin silicon film deposits on the surface of the silicon wafers and on the interior wall of the reaction chamber, including on the the $Al_2O_3$ layers 24 and 25.

After the desired silicon film thickness has accumulated on the silicon wafers, the gas supply to inlets 17 and 18 is shut off, the vacuum is discontinued, door 16 is opened and the wafer holder is removed from the reaction chamber.

After several deposition operations have been conducted on different wafers, the undesired silicon deposit on the inside walls of the apparatus accumulates to a thickness of 10 or more microns, which presents a danger of cracking and contamination, and removal is desirable.

At this point, or earlier, the apparatus is closed and a vacuum of about $10^{-6}$ Torr is created within the reaction chamber. Then, a mixture of $CF_4$ and $O_2$, or $NF_3$ gas is introduced through inlet 20. When the operating pressure is in the range between 0.1 and 0.4 Torr, the microwave power supply 22 is turned on to generate a high frequency of about 2.45 GHz at the applicator 21 surrounding the etchant gas tube 15 to develop and supply an etchant gas plasma to the reaction chamber.

The gas plasma reacts with and vaporizes the silicon film present on the interior walls of the apparatus including on the surfaces of $Al_2O_3$ coatings 24 and 25.

After a reasonable period of time, the undesirable silicon film deposit is completely vaporized and removed and the apparatus is ready for deposition use.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

We claim:

1. An apparatus for the chemical vapor deposition of thin films of silicon onto a suitable substrate within a reaction chamber, and for the periodic removal of undesirable silicon deposits from the interior surface of the reaction chamber, comprising a chemical vapor deposition reaction chamber comprising a fused quartz housing having an interior surface carrying a continuous thin barrier layer of a refractory metal oxide having a thickness between about 0.25 and 1.0 microns, first inlet means for supplying processing gas to said reaction chamber under temperature and vacuum conditions which cause the desired deposit of a silicon film onto the surface of a suitable substrate within said reaction chamber and which produce the undesired deposit of a silicon film onto the interior surface of said reaction chamber including onto said continuous thin barrier layer of refractory metal oxide, and second inlet means for generating and supplying etchant gas plasma to said reaction chamber to react with, volatilize and remove said undesired deposit, said etchant gas normally etching and/or corroding a fused quartz housing, and said barrier layer of refractory metal oxide being inert to said etchant gas and providing a protective barrier on said fused quartz housing.

2. An apparatus according to claim 1 in which said refractory metal oxide is selected from the group consisting of zirconium oxide, hafnium oxide and aluminum oxide.

3. An apparatus according to claim 1 in which said second inlet means for generating and supplying etchant gas plasma to said reaction chamber comprises a fused quartz conduit communicating between said reaction chamber and a valved supply of etchant gas, and having a thin, continuous barrier layer of refractory metal oxide covering the interior surface of said fused quartz conduit, and microwave-applying means associated with said conduit for producing a plasma of said etchant gas within said conduit for supply to said reaction chamber.

4. An apparatus according to claim 3 in which said barrier layer covering the interior surface of said quartz conduit has a thickness between about 0.25 and 1.0 microns.

5. An apparatus according to claim 3 in which said refractory metal oxide is selected from the group consisting of zirconium oxide, hafnium oxide and aluminum oxide.

6. An apparatus according to claim 1 comprising an elongate tubular fused quartz housing having a wide, flanged entrance end for receiving substrates to be coated and a narrow downstream evacuation end, an annular gas manifold, the downstream end of which is sealingly-engaged with the flanged entrance end of said tubular quartz housing, and the upstream end of which comprises an axial opening, said annular manifold having a transverse opening communicating with said etching means, a cover sealingly-engaged with the upstream end of said gas manifold and removable to permit access to the interior of said housing, and at least one opening through said cover communicating with said means for supplying processing gas to said reaction chamber.

7. An apparatus according to claim 1 comprising an annular resistance heating means surrounding said fused quartz housing for heating said barrier sufficiently to cause said deposit of silicon.

8. Process for producing an apparatus having a reaction chamber for the chemical vapor deposition of thin films of silicon onto a suitable substrate within said reaction chamber, and for the periodic in-situ removal of undesirable silicon deposits from the interior surface of the reaction chamber, comprising forming a chemical vapor deposition reaction chamber by coating the interior surface of a fused quartz housing with a continuous thin barrier layer of a refractory metal oxide having a thickness between about 0.25 and 1 micron, providing first inlet means for supplying processing gas to said reaction chamber under temperature and vacuum conditions which cause the desired deposit of a silicon film onto the surface of a suitable substrate within said reaction chamber and which produce the undesired deposit of a silicon film onto the interior surface of said reaction chamber including onto said continuous thin barrier layer of refractory metal oxide, and providing second inlet means for generating and supplying etchant gas plasma to said reaction chamber to react with, volatilize and remove said undesired deposit, said etchant gas normally etching and/or corroding a fused quartz housing, and said barrier layer of refractory metal oxide being inert to said etchant gas and providing a protective barrier on said fused quartz housing.

9. Process according to claim 8 in which said refractory metal oxide is selected from the group consisting of zirconium oxide, hafnium oxide and aluminum oxide.

10. Process according to claim 8 which comprises providing said reaction chamber with a second inlet means comprising a fused quartz conduit communicating between said reaction chamber and a valved supply of etchant gas, and coating said conduit with a thin, continuous barrier layer of refractory metal oxide covering the interior surface of said fused quartz conduit, and providing microwave-applying means associated with said conduit for producing a plasma of said etchant gas within said conduit for supply to said reaction chamber.

11. Process according to claim 10 which comprises applying said barrier coating in a thickness between about 0.25 and 1.0 micron.

12. Process according to claim 10 in which said refractory metal oxide is selected from the group consisting of zirconium oxide, hafnium oxide and aluminum oxide.

13. Process according to claim 8 comprising forming said reaction chamber as an elongate tubular fused quartz housing having a wide, flanged entrance end for receiving substrates to be coated, and a narrow downstream evacuation end, providing an annular gas manifold having an upstream end comprising an axial opening, an open downstream end and an intermediate transverse opening, sealingly-engaging the downstream end of said manifold with the wide flanged entrance end of said tubular quartz housing, sealingly-engaging said transverse opening with said etching means, and providing the upstream end of said gas manifold with a cover which is removable to permit access to the interior of said housing, said cover containing at least one opening communicating with said means for supplying processing gas to said reaction chamber.

14. Process according to claim 8 which comprises providing said fused quartz housing with an annular resistance heating means which surrounds said housing for heating said barrier layer sufficiently to cause said deposit of silicon.

15. Process for the chemical vapor deposition of thin films of silicon onto a suitable substrate within a reaction chamber, and for the periodic removal of undesirable silicon deposits from the interior surface of the reaction chamber, comprising introducing a said substrate within a chemical vapor deposition reaction chamber comprising a fused quartz housing having an interior surface carrying a continuous thin barrier layer of refractory metal oxide having a thickness between about 0.25 and 1.0 microns, supplying processing gas to said reaction chamber through a first inlet under temperature and vacuum conditions which cause the desired deposit of a silicon film onto the surface of said substrate within said reaction chamber and which produce the undesired deposit of a silicon film onto the interior surface of said reaction chamber including onto said thin barrier layer and periodically supplying etchant gas plasma to said reaction chamber through a second inlet to react with, volatilize and remove said undesired deposit, said etchant gas being one which normally etches and/or corrodes a fused quartz housing, and said barrier layer of refractory metal oxide being inert to said etchant gas and providing a protective barrier on said fused quartz housing.

16. Process according to claim 15 in which said refractory metal oxide is selected from the group consisting of zirconium oxide, hafnium oxide and aluminum oxide.

17. Process according to claim 15 which comprises periodically supplying etchant gas plasma to said reaction chamber through a second inlet comprising a fused quartz conduit communicating between said reaction chamber and a valved supply of etchant gas, said conduit comprising a thin, continuous barrier layer of refractory metal oxide covering the interior surface of said fused quartz conduit, and applying microwaves to said conduit to produce a plasma of said etchant gas within said conduit for supply to said reaction chamber.

18. Process according to claim 17 in which said barrier layer has a thickness between about 0.25 and 1.0 micron.

19. Process according to claim 17 in which said refractory metal oxide is selected from the group consisting of zirconium oxide, hafnium oxide and aluminum oxide.

* * * * *